(12) United States Patent
Zhang

(10) Patent No.: US 8,909,179 B2
(45) Date of Patent: Dec. 9, 2014

(54) METHOD AND APPARATUS FOR CONTROLLING TRANSMIT SIGNAL OF RADIO FREQUENCY POWER AMPLIFIER

(71) Applicant: Huawei Device Co., Ltd., Shenzhen (CN)

(72) Inventor: Gang Zhang, Shenzhen (CN)

(73) Assignee: Huawei Device Co., Ltd., Shenzhen (CN)

( * ) Notice: Subject to any disclaimer, the term of this patent is extended or adjusted under 35 U.S.C. 154(b) by 0 days.

(21) Appl. No.: 13/709,879

(22) Filed: Dec. 10, 2012

(65) Prior Publication Data

US 2013/0099861 A1    Apr. 25, 2013

Related U.S. Application Data

(63) Continuation of application No. PCT/CN2011/079022, filed on Aug. 27, 2011.

(30) Foreign Application Priority Data

Aug. 27, 2010   (CN) .......................... 2010 1 0268913

(51) Int. Cl.
| H04B 1/04 | (2006.01) |
| H03G 3/00 | (2006.01) |
| H03G 3/30 | (2006.01) |
| H03F 3/189 | (2006.01) |
| H03F 3/20 | (2006.01) |

(52) U.S. Cl.
CPC .............. *H03G 3/004* (2013.01); *H03G 3/3042* (2013.01); *H03F 3/189* (2013.01); *H03F 3/20* (2013.01)
USPC ..... 455/127.1; 455/522; 455/126; 455/127.2; 455/114.3; 330/127; 330/136; 330/199

(58) Field of Classification Search
CPC .......... H03G 3/004; H03F 3/20; H04W 52/04
USPC .......... 455/522, 91, 126, 127.1, 127.2, 114.3; 330/127, 136, 199
See application file for complete search history.

(56) References Cited

U.S. PATENT DOCUMENTS 5,574,993 A * 11/1996 Kobayashi et al. ........... 455/126
6,008,698 A    12/1999 Dacus et al.
(Continued)

FOREIGN PATENT DOCUMENTS

| CN | 1215260 | 4/1999 |
| CN | 1252905 | 5/2000 |

(Continued)

OTHER PUBLICATIONS

International Search Report, dated Nov. 11, 2011, in corresponding International Application No. PCT/CN2011/079022 (7 pp.).

(Continued)

*Primary Examiner* — Tuan Pham
(74) *Attorney, Agent, or Firm* — Staas & Halsey LLP

(57) ABSTRACT

A method and an apparatus for controlling a transmit signal of a radio frequency power amplifier are provided. The method includes: adjusting a power supply voltage of the power amplifier to an efficiency point power supply voltage under designated transmit power; querying correspondence between an input voltage and transmit power at each power level under the efficiency point power supply voltage; and adjusting, according to the correspondence, an input voltage to an input voltage corresponding to the designated transmit power. The embodiments of the present invention, the power amplifier is enabled to work at an optimum efficiency point while the transmit power of the power amplifier is under control, which improves efficiency of the power amplifier.

6 Claims, 4 Drawing Sheets

(56) References Cited

U.S. PATENT DOCUMENTS

| | | | |
|---|---|---|---|
| 6,148,220 | A | 11/2000 | Sharp et al. |
| 2001/0020872 | A1 | 9/2001 | Miyazawa |
| 2002/0171481 | A1 | 11/2002 | Sasho et al. |
| 2003/0034839 | A1* | 2/2003 | Poggi et al. ............ 330/132 |
| 2003/0218507 | A1 | 11/2003 | Inoue et al. |
| 2005/0151586 | A1 | 7/2005 | Grillo et al. |
| 2005/0156669 | A1 | 7/2005 | Ando |
| 2006/0087372 | A1 | 4/2006 | Henze |
| 2006/0114075 | A1 | 6/2006 | Janosevic et al. |
| 2006/0220739 | A1 | 10/2006 | Ben-Ayun et al. |
| 2008/0218269 | A1 | 9/2008 | Kirisawa |
| 2009/0093225 | A1 | 4/2009 | Fan |
| 2009/0237156 | A1 | 9/2009 | Griffiths et al. |
| 2009/0322422 | A1* | 12/2009 | Jones et al. ............ 330/127 |

FOREIGN PATENT DOCUMENTS

| | | |
|---|---|---|
| CN | 1645755 | 7/2005 |
| CN | 1672322 | 9/2005 |
| CN | 1697530 | 11/2005 |
| CN | 1729637 | 2/2006 |
| CN | 1983851 | 6/2007 |
| CN | 101262262 | 9/2008 |
| CN | 101677228 | 3/2010 |
| CN | 101938258 | 1/2011 |
| GB | 2329087 | 3/1999 |
| WO | WO2010/064091 | 6/2010 |

OTHER PUBLICATIONS

Form PCT/ISA/220, dated Oct. 11, 2011, in corresponding International Application No. PCT/CN2011/079022 (3 pp.).

Form PCT/ISA/237, dated Oct. 11, 2011, in corresponding International Application No. PCT/CN2011/079022 (5 pp.).

First Office Action, dated Aug. 21, 2012, in corresponding Chinese Application No. 201010268913.3 (9 pp.).

PCT Written Opinion of the International Searching Authority mailed Nov. 10, 2011.

Extended European Search Report, dated Aug. 14, 2013, in corresponding European Application No. 11819441.4 (6 pp.).

International Search Report of Corresponding PCT Application PCT/CN2011/079022 mailed Nov. 10, 2011.

* cited by examiner

METHOD AND APPARATUS FOR CONTROLLING TRANSMIT SIGNAL OF RADIO FREQUENCY POWER AMPLIFIER

CROSS-REFERENCE TO RELATED APPLICATIONS

This application is a continuation of International Application No. PCT/CN2011/079022, filed on Aug. 27, 2011, which claims priority to Chinese Patent Application No. 201010268913.3, filed on Aug. 27, 2010, both of which are hereby incorporated by reference in their entireties.

FIELD OF THE INVENTION

The present invention relates to the field of communications, and specifically, to a method and apparatus for controlling a transmit signal of a radio frequency power amplifier.

BACKGROUND OF THE INVENTION

At present, although mobile phones of the same model which are produced by a mobile phone vendor use the same components, parameters of the components still have tiny differences, and data preconfigured in the mobile phones by the mobile phone vendor is not precise enough, so that the mobile phones manufactured through different parameter combinations consequentially have differences. Before formally starting to use a mobile phone, correspondence between a transmit signal and an input voltage of a power amplifier shall be detected to retrieve correspondence between transmit power of the transmit signal and the input voltage. Therefore, the input voltage may be precisely adjusted, so as to make the transmit power of the power amplifier meet a requirement of the transmit signal.

The power amplifier generally has multiple power levels, correspondence between transmit power and an input voltage under each power level is individually a different linear relationship with others, and a method for detecting the correspondence between the transmit power and the input voltage of the power amplifier under each power level is as follows: A pair value (P, Vacp) of transmit power and an input voltage within a range of one power level is detected, and according to the correspondence between the transmit power and the input voltage, a curve of the linear relationship between the transmit power and the input voltage under the power level may be obtained by calculation; and in the same way, a curve of the linear relationship between the transmit power and the input voltage under each power level may be detected.

A method for controlling a transmit signal of a radio frequency power amplifier in the prior art includes: according to transmit power required by the transmit signal, querying correspondence between transmit power and an input voltage at each power level and obtaining an input voltage and a power level corresponding to the transmit power, adjusting a gain mode to the power level and adjusting an input voltage to the input voltage corresponding to the transmit power, so as to make the transmit signal of the power amplifier meet the requirement.

In the research and implementation process of the prior art, the inventor of the present invention finds that, in the foregoing prior art, a power supply voltage of the power amplifier is constant and unchanged; however, in order to reduce power consumption of the power amplifier, so as to make the power amplifier work at an optimum efficiency point, the power supply voltage of the power amplifier is usually adjusted. After the adjustment, the correspondence between the transmit power and the input voltage under the constant power supply voltage may not serve as precise data for controlling the transmit signal, and it is unable to control the transmit signal to meet the transmitting requirement, according to the correspondence between the transmit power and the input voltage under the constant power supply voltage.

SUMMARY OF THE INVENTION

Embodiments of the present invention provide a method and apparatus for controlling a transmit signal of a radio frequency power amplifier, so as to precisely adjust the transmit signal of the power amplifier.

An embodiment of the present invention provides a method for controlling a transmit signal of a radio frequency power amplifier, including:

adjusting a power supply voltage of the power amplifier to an efficiency point power supply voltage of the power amplifier under designated transmit power;

querying correspondence between an input voltage and transmit power at each power level under the efficiency point power supply voltage; and adjusting an input voltage of the power amplifier to an input voltage corresponding to the designated transmit power, according to the correspondence under the power supply voltage.

Another embodiment of the present invention provides an apparatus for controlling a transmit signal of a radio frequency power amplifier, including:

an adjusting module, configured to adjust a power supply voltage of the power amplifier to an efficiency point power supply voltage of the power amplifier under designated transmit power;

a querying module, configured to query correspondence between an input voltage and transmit power at each power level under the efficiency point power supply voltage; and a control module, configured to adjust an input voltage of the power amplifier to an input voltage corresponding to the designated transmit power, according to the correspondence under the power supply voltage.

According to the embodiments of the present invention, through detecting the efficiency point power supply voltage of the transmit power required by the transmit signal and according to the correspondence between the input voltage and the transmit power at each power level under the efficiency point power supply voltage, the power level and the input voltage are adjusted, so as to make the transmit power meet the requirement of the transmit signal. The correspondence between the transmit power and the input voltage under the efficiency point power supply voltage may be found according to the current efficiency point power supply voltage, so as to implement precise control of the transmit signal in a case of an adjustable power supply voltage, and to avoid that after the adjustment of the power supply voltage of the power amplifier, correspondence between the transmit power and the input voltage detected under a constant voltage is not precise enough and result in cannot be used to control the transmit signal of the power amplifier with the adjustable power supply voltage. The power amplifier may also be enabled to work at an optimum efficiency point while control of the transmit power of the power amplifier is implemented, which improves efficiency of the power amplifier.

BRIEF DESCRIPTION OF THE DRAWINGS

To illustrate the technical solutions in the embodiments of the present invention or in the prior art more clearly, accompanying drawings needed for describing the embodiments or the prior art are briefly introduced in the following. Obviously, the accompanying drawings in the following description are some embodiments of the present invention, and persons of ordinary skill in the art may obtain other accompanying drawings from these accompanying drawings without making creative efforts.

DETAILED DESCRIPTION OF THE EMBODIMENTS

Embodiments of the present invention provide a method for controlling a transmit signal of a radio frequency power amplifier, where a power supply voltage of the power amplifier is adjustable. The embodiments of the present invention further provides an apparatus for controlling the transmit signal of the radio frequency power amplifier corresponding to the method. Detailed description is made hereinafter, respectively.

Figure 1:
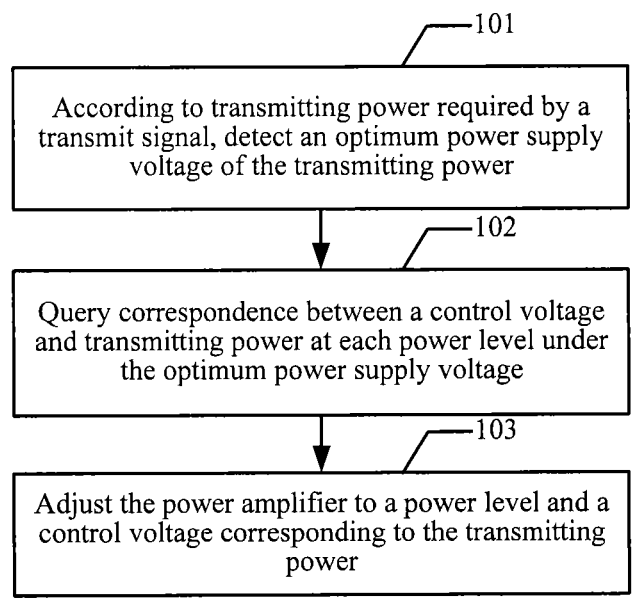
FIG. 1 is a basic schematic flowchart of a method for controlling a transmit signal of a radio frequency power amplifier according to a first embodiment of the present invention.

Reference may be made to FIG. 1 for a basic process of a method for controlling a transmit signal of a radio frequency power amplifier according to a first embodiment of the present invention. The method mainly includes:

Step 101: Adjust a power supply voltage of the power amplifier to an efficiency point power supply voltage under designated transmit power.

A user designates the transmit power, according to a requirement of a transmit signal of the power amplifier. Under the designated transmit power, the power supply voltage of the power amplifier may be adjusted to change working efficiency of the power amplifier. Under a specific power supply voltage, the working efficiency is highest if the power amplifier reaches the designated transmit power, and the power supply voltage at this moment is called an efficiency point power supply voltage under the transmit power.

Figure 2:
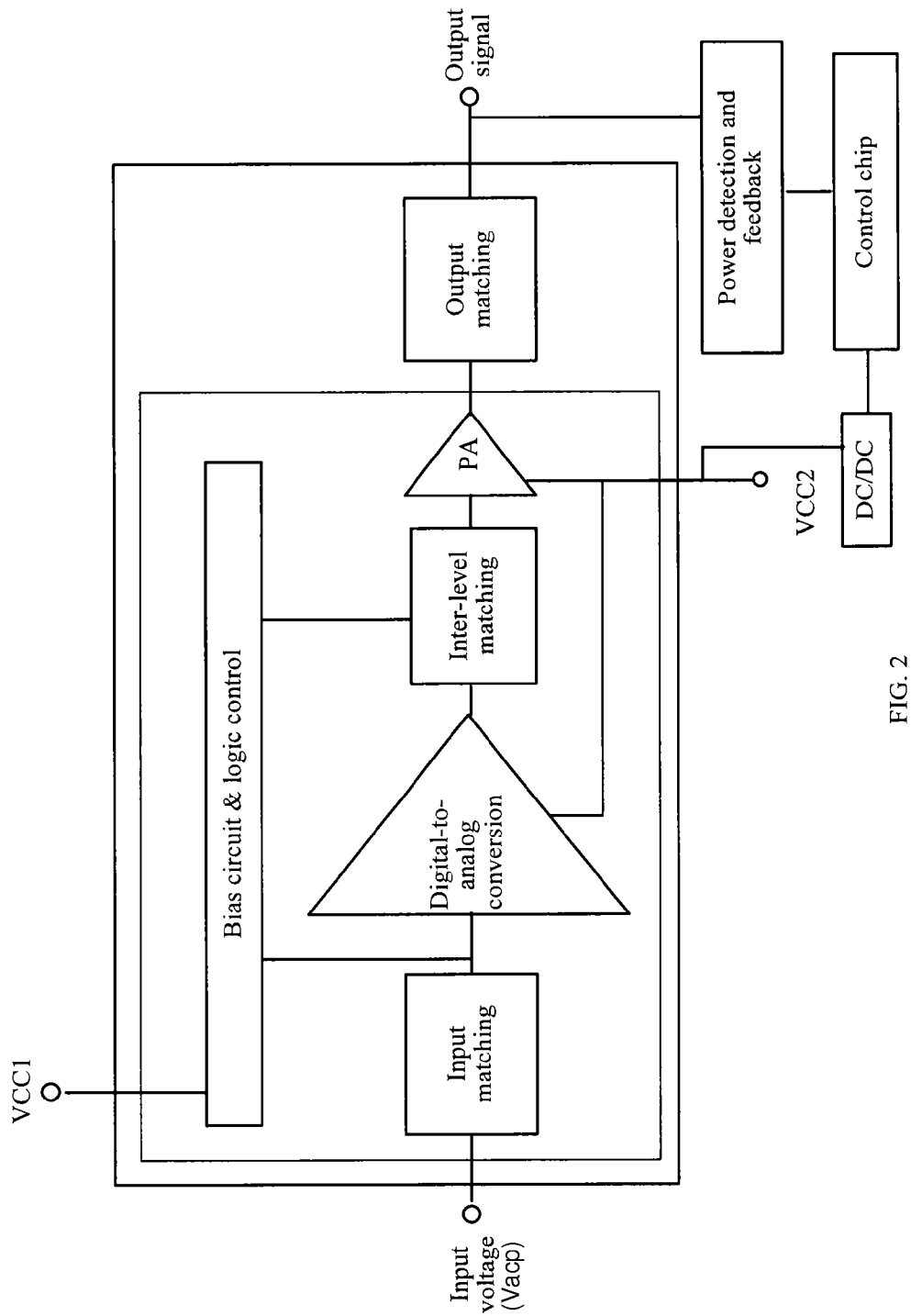
FIG. 2 is a schematic diagram of the method for controlling the transmit signal of the radio frequency power amplifier according to the first embodiment of the present invention.

Referring to FIG. 2, the power amplifier is powered in a dual-input power supply manner. A power supply voltage Vcc2 mainly supplies power to the internal power amplifier (PA), and the power supply voltage Vcc2 of the power amplifier is adjusted to a proper value (the efficiency point working voltage), so as to make power consumption of the power amplifier reach the lowest. A power supply voltage Vcc1 mainly supplies power to a bias circuit and a logic circuit. Through detecting and feedbacking of power of an output signal, and using a control chip to adjust an output voltage of a voltage converter (DC/DC), so that different power supply voltages Vcc2 are adopted if transmit power of the PA is different, so that the power supply voltage Vcc2 of the PA is controlled to enable the PA to work at an optimum efficiency point.

Step 102: Query correspondence between an input voltage and transmit power at each power level under the efficiency point power supply voltage.

Under each power supply voltage, the correspondence between the input voltage Vacp and the transmit power may be premeasured and precalculated. We regard that the correspondence of the transmit power and the input voltage at each power level as one function, each the function is correspondingly stored in one table, and the table records the function, that is, the correspondence between the input voltage and the transmit power under one power level. For, when the power amplifier has n power levels, that is, the power amplifier has N types of gains, under each power supply voltage, there is data of n tables indicating the correspondence between the transmit power and the input voltage under each power level. If the power supply voltage has k types of options, each of these k power supply voltages has data of n tables, and there are nk tables in total to record the correspondences between the input voltages and the transmit power. When querying these correspondences, the power supply voltage Vcc2 is determined firstly, and the correspondences between the input voltages and the transmit power at each power level under the Vcc2 is queried in the n tables under the power supply voltage.

Step 103: Adjust an input voltage of the power amplifier to an input voltage corresponding to the designated transmit power, according to the correspondence between the input voltage and the transmit power at each power level under the efficiency point power supply voltage.

An input voltage V corresponding to the designated transmit power is found in the correspondence between the input voltage and the transmit power under the efficiency point power supply voltage, and the input voltage is adjusted to V. Then, the power amplifier works at the efficiency point power supply voltage when transmit power of the transmit signal reaches the designated transmit power.

According to the embodiment, through detecting the efficiency point power supply voltage of the transmit power required by the transmit signal and according to the correspondence between the input voltage and the transmit power at each power level under the efficiency point power supply voltage, the power level and the input voltage are adjusted, so as to make the transmit power meet the requirement of the transmit signal. While the transmit signal is controlled to meet the transmitting requirement, the working efficiency of the power amplifier is improved through calibration data of the power amplifier under different power supply voltages.

Figure 3:
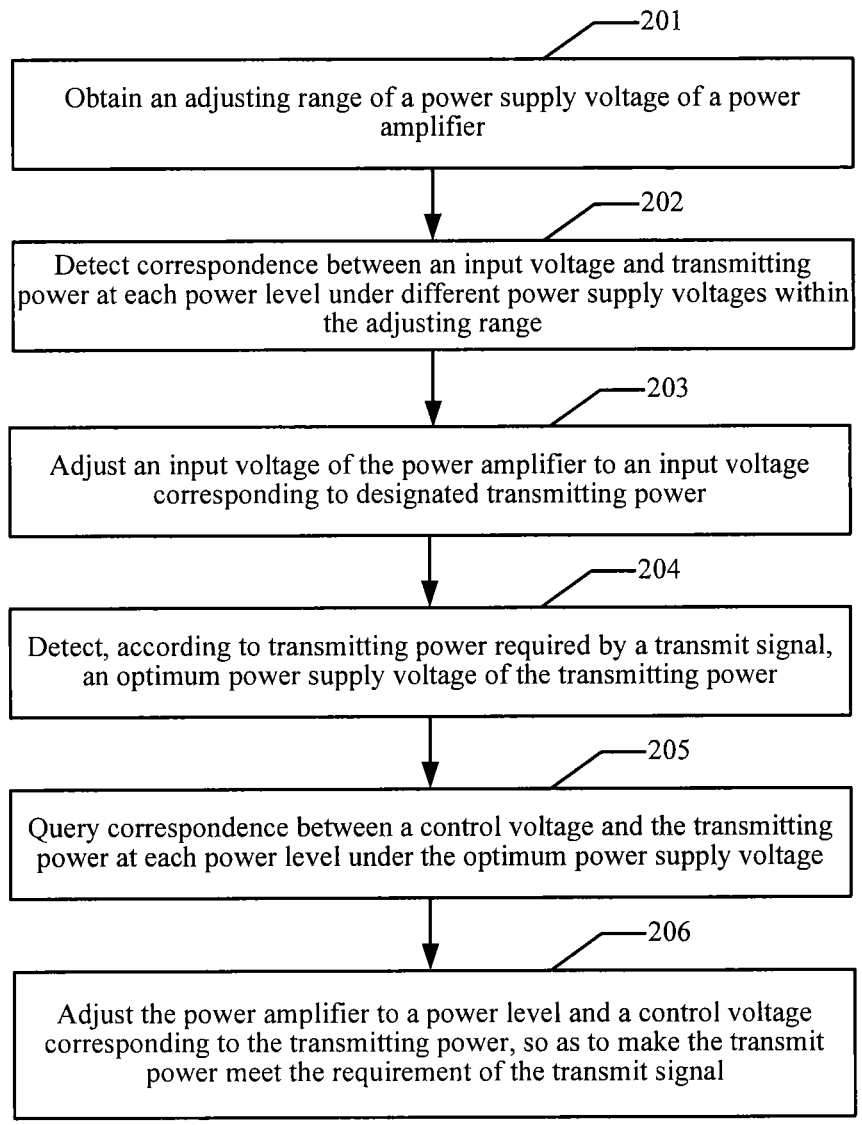
FIG. 3 is a basic schematic flowchart of a method for controlling a transmit signal of a radio frequency power amplifier according to a second embodiment of the present invention.

For ease of understanding, the method for controlling the transmit signal of the radio frequency power amplifier in the embodiment of the present invention is described in detail in the following. Referring to FIG. 3, a method for controlling the transmit signal of the radio frequency power amplifier according to a second embodiment of the present invention includes:

Step 201: Obtain an adjusting range of a power supply voltage of a power amplifier.

Step 202: Detect correspondence between an input voltage and transmit power at each power level under different power supply voltages within the adjusting range.

A power supply voltage Vcc2 of the power amplifier is a dynamically adjustable voltage. To detect the correspondence between the input voltage and the transmit power at each power level under different power supply voltages, for example, assume that a range of the power supply voltage is $3.0+K*\Delta V$ (where one voltage value is obtained at an interval of $\Delta V$), the overall adjusting range has K types of different power supply voltages, and correspondence between input voltages and transmit power at n power levels, where the correspondence is detected under the K types of different voltages, are stored.

Step 203: Detect a current power supply voltage, and adjust, according to correspondence between an input voltage and transmit power under the current power supply voltage, an input voltage Vacp of the power amplifier to an input voltage corresponding to designated transmit power, so as to make transmit power of transmit signal of the power amplifier reach the designated transmit power.

Step 204: Adjust the power supply voltage of the power amplifier to an efficiency point power supply voltage of the designated transmit power.

The power amplifier is powered in a dual-input power supply manner. A Vcc1 mainly supplies power to a logic circuit and a bias circuit both inside the power amplifier, and a Vcc2 mainly supplies power to the internal power amplifier. The power supply voltage Vcc2 of the power amplifier is adjusted to a proper value to make power consumption of the power amplifier reach the lowest point. Through detecting the transmit power of the power amplifier, the efficiency point power supply voltage under the transmit power is adjusted according to the transmit power, so as to enable the power amplifier to work at an optimum efficiency point.

Step 205: Query correspondence between the input voltage and the transmit power at each power level under the efficiency point power supply voltage.

A linear correspondence exists between the transmit power and the input voltage at each power level. For example, when the Vcc2 may have K types of options and the power amplifier has n power levels, if the linear correspondence between the transmit power and the input voltage at each power level is regarded as one table, there is data of nK tables.

In the data of these tables, the data of the n tables at different power levels under the efficiency point power supply voltage is queried to find the correspondence among the transmit power and the input voltage and the power level.

For example, the efficiency point power supply voltage is 3.0+2 ΔV, and correspondence between the transmit power and the input voltage at each of the n power levels when the power supply voltage is 3.0+2 ΔV is queried, and it is found that the input voltage corresponding to the transmit power P is Vacp and the power level is n.

Step 206: Adjust the power amplifier to the power level and the input voltage corresponding to the transmit power, so as to make the transmit power meet a requirement of the transmit signal.

According to the embodiment of the present invention, through detecting the efficiency point power supply voltage of the transmit power required by the transmit signal and according to the correspondence between the input voltage and the transmit power at each power level under the efficiency point power supply voltage, the power level and the input voltage are adjusted, so as to make the transmit power meet the requirement of the transmit signal. While the transmit signal is controlled to meet the transmitting requirement, working efficiency of the power amplifier is improved through calibration data of the power amplifier under different power supply voltages.

Figure 4:
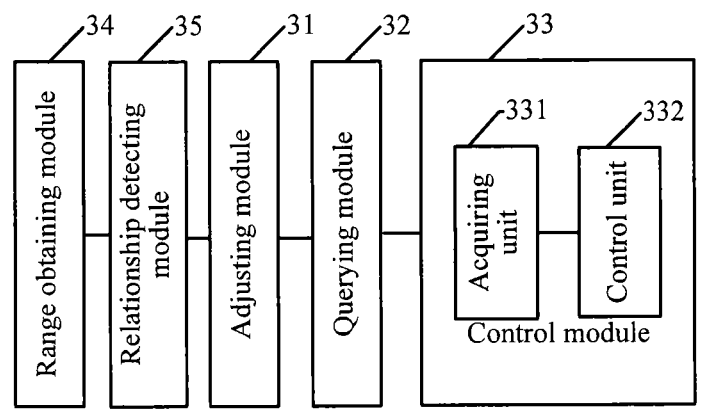
FIG. 4 is a schematic structural diagram of an apparatus for controlling a transmit signal of a radio frequency power amplifier according to an embodiment of the present invention.

An apparatus for controlling a transmit signal of a radio frequency power amplifier, configured to implement the foregoing embodiments of the method for controlling the transmit signal of the radio frequency power amplifier, is described in the following Reference may be made to FIG. 4 for its schematic structural diagram.

The apparatus for controlling the transmit signal of the radio frequency power amplifier includes:

an adjusting module 31, configured to adjust a power supply voltage of the power amplifier to an efficiency point power supply voltage of the power amplifier under designated transmit power;

a querying module 32, configured to query correspondence between an input voltage and transmit power at each power level under the efficiency point power supply voltage; and a control module 33, configured to adjust an input voltage of the power amplifier to an input voltage corresponding to the designated transmit power, according to the correspondence under the power supply voltage.

Preferably, the apparatus further includes:

a range obtaining module 34, configured to obtain an adjusting range of the power supply voltage of the power amplifier; and a relationship detecting module 35, configured to detect correspondence between the input voltage and the transmit power at each power level under different power supply voltages within the adjusting range.

Preferably, the control module 33 specifically includes:

an obtaining unit 331, configured to obtain a power level and the input voltage which correspond to the transmit power; and a control unit 332, configured to adjust a gain mode to reach the power level and adjust the input voltage, so as to make the transmit power meet a requirement of the transmit signal.

For ease of understanding, the foregoing embodiments are described in detail with a specific application scenario below. Specifically, reference may also be made to FIG. 3, which is a schematic flowchart of the application scenario.

Step 201: A range obtaining module 34 obtains an adjusting range of a power supply voltage of a power amplifier as 3.0+K*ΔV.

Step 202: A relationship detecting module 35 detects correspondence between an input voltage and transmit power at each power level under K types of different power supply voltages within the adjusting range.

A range of the power supply voltage is 3.0+K*ΔV, where one voltage value is obtained at an interval of ΔV, and correspondence between input voltage and transmit power under each gain modes of two power levels detected under the K types of different voltages are stored.

At a power supply voltage of 3.0+ΔV, a linear relationship between transmit power and an input voltage under a gain mode (power level) as 1 is detected, and data of the linear relationship is recorded in Table 1. In the same way, a linear relationship between transmit power and an input voltage under a gain mode (power level) as 2 and at the power supply voltage of 3.0+ΔV may be detected, linear relationships between the transmit power and the input voltages at different power levels under each power supply voltage are calculated, and each linear relationship is individually recorded in a table, then there is data of 2K tables, and one database of the correspondence between the transmit power and the input voltages is formed.

Step 203: A control module 33 detects a current power supply voltage, and adjusts an input voltage Vacp of the power amplifier to an input voltage corresponding to designated transmit power, according to correspondence between an input voltage and transmit power under the current power supply voltage, so as to make transmit power of a transmit signal of the power amplifier reaches the designated transmit power.

Step 204: An adjusting module 31 adjusts the power supply voltage of the power amplifier to an efficiency point power supply voltage Vcc2 under the designated transmit power, according to the designated transmit power.

Step 205: A searching module 32 searches, in the database obtained in step 202, two tables recording the correspondence between the input voltage and the transmit power at each of the two power levels under the efficiency point power supply voltage, and the control module 33 finds the gain mode as 1 and the input voltage as Vacp.

Step 206: The control module 33 adjusts the gain mode as 1 and adjusts the input voltage as Vacp, so as to make the transmit power meet a requirement of the transmit signal.

According to the embodiment of the present invention, through detecting the efficiency point power supply voltage of the transmit power required by the transmit signal and according to the correspondence between the input voltage and the transmit power at each power level under the efficiency point power supply voltage, the power level and the input voltage are adjusted, so as to make the transmit power meet the requirement of the transmit signal. While the transmit signal is controlled, working efficiency of the power amplifier is improved to meet the transmitting requirement through calibration data of the power amplifier under different power supply voltages.

Persons of ordinary skill in the art may understand that all or part of the steps of the methods according to the foregoing embodiments may be completed by a program instructing relevant hardware. The program may be stored in a computer readable storage medium. The storage medium may include a ROM, a RAM, a magnetic disk, or a compact disk, and so on.

The method and apparatus provided in the embodiments of the present invention are described in detail in the foregoing. The principle and implementation manner of the present invention are elaborated here by using specific examples. The description of the foregoing embodiments is merely used to help understand the method and a core idea of the present invention. Meanwhile, persons of ordinary skill in the art may make variations to the present invention in terms of the specific implementation manners and application scopes according to the idea of the present invention. Therefore, the content of specification shall not be understood as a limit to the present invention.

What is claimed is:

1. A method for controlling a transmit signal of a radio frequency power amplifier, comprising:
    adjusting, an efficiency point power supply voltage of a DC/DC voltage converter to a power amplifier under a designated transmit power for the power amplifier;
    querying recorded correspondence between an input voltage for the power amplifier, transmit power of the power amplifier at power levels of the power amplifier and the adjusted efficiency point power supply voltage of the DC/DC voltage converter; and
    adjusting the input voltage for the power amplifier to correspond to the designated transmit power for the power amplifier, according to the queried correspondence between the input voltage for the power amplifier and the transmit power of the power amplifier under the adjusted efficiency point power supply voltage of the DC/DC voltage converter,
    wherein the adjusting the input voltage for the power amplifier comprises:
        obtaining the queried power level and the input voltage for the power amplifier corresponding to the transmit power of the power amplifier; and
        adjusting, for the power amplifier, a gain mode to reach the queried power level and the input voltage, so as to make the transmit power of the power amplifier meet a requirement of the transmit signal of the power amplifier.

2. The method according to claim 1, wherein before the adjusting the efficiency point power supply voltage of the DC/DC voltage converter to the power amplifier under the designated transmit power, the method further comprises:
    obtaining an adjusting range of the power supply voltage of the DC/DC voltage converter of the power amplifier; and
    detecting correspondence between an input voltage for the amplifier and a transmit power of the power amplifier at power levels of the power amplifier under different power supply voltages of the DC/DC voltage converter within the adjusting range.

3. An apparatus for controlling a transmit signal of a radio frequency power amplifier, comprising:
    computer hardware that implements:
        an adjusting module, configured to adjust an efficiency point power supply voltage of a DC/DC voltage converter to the power amplifier under a designated transmit power for the power amplifier;
        a querying module, configured to query recorded correspondence between an input voltage for the power amplifier, transmit power of the power amplifier at power levels of the power amplifier and the adjusted to power consumption efficiency point power supply voltage of the DC/DC voltage converter; and
        a control module, configured to adjust the input voltage for the power amplifier to correspond to the designated transmit power for the power amplifier, according to the queried correspondence between the input voltage for the power amplifier and the transmit power of the power amplifier under the adjusted efficiency point power supply voltage of the DC/DC voltage converter;
    the control module further comprises:
        an obtaining unit, configured to obtain the queried power level and the input voltage for the power amplifier corresponding to the transmit power of the power amplifier; and
        a control unit, configured to adjust, for the power amplifier, a gain mode to reach the queried power level and the input voltage, so as to make the transmit power of the power amplifier meet a requirement of the transmit signal of the power amplifier.

4. The apparatus according to claim 3, further comprising:
    a range obtaining module, configured to obtain an adjusting range of the power supply voltage of the DC/DC voltage converter of the power amplifier; and
    a relationship detecting module, configured to detect correspondence between an input voltage for the amplifier and a transmit power of the power amplifier at power levels of the amplifier under different power supply voltages of the DC/DC voltage converter within the adjusting range.

5. An apparatus for controlling a transmit signal of a radio frequency power amplifier, comprising:
    adjusting, by a processor, an efficiency point power supply voltage of a DC/DC voltage converter to a power amplifier under a designated transmit power for the power amplifier;
    querying, by the processor, recorded correspondence between an input voltage for the power amplifier, transmit power of the power amplifier at power levels of the power amplifier and the adjusted efficiency point power supply voltage of the DC/DC voltage converter; and
    adjusting, by the processor, the input voltage for the power amplifier to correspond to the designated transmit power for the power amplifier, according to the queried correspondence between the input voltage for the power amplifier and the transmit power of the power amplifier under the adjusted efficiency point power supply voltage of the DC/DC voltage converter, wherein the processor is configured to obtain the queried power level and the input voltage for the power amplifier corresponding to the transmit power of the power amplifier, and to adjust, for the power amplifier, a gain mode to reach the queried power level and the input voltage, so as to make the transmit power of the power amplifier meet a requirement of the transmit signal of the power amplifier.

6. The apparatus according to claim 5, wherein the processor is configured to obtain an adjusting range of the power supply voltage of the DC/DC voltage converter of the power amplifier; and to detect correspondence between an input voltage for the amplifier and a transmit power of the power amplifier at power levels of the amplifier under different power supply voltages of the DC/DC voltage converter within the adjusting range.

* * * * *